United States Patent
Chindalore et al.

(10) Patent No.: US 7,314,798 B2
(45) Date of Patent: Jan. 1, 2008

(54) METHOD OF FABRICATING A NONVOLATILE STORAGE ARRAY WITH CONTINUOUS CONTROL GATE EMPLOYING HOT CARRIER INJECTION PROGRAMMING

(75) Inventors: Gowrishankar L. Chindalore, Austin, TX (US); Cheong M. Hong, Austin, TX (US); Craig T. Swift, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/188,583

(22) Filed: Jul. 25, 2005

(65) Prior Publication Data

US 2007/0020831 A1    Jan. 25, 2007

(51) Int. Cl.
    H01L 21/336    (2006.01)
(52) U.S. Cl. ............... 438/259; 438/197; 438/589; 257/E21.679; 257/E21.422; 257/E21.646; 257/E27.103; 257/E29.304
(58) Field of Classification Search ............... 438/197, 438/259, 589; 257/E21.679, E27.103, E21.422, 257/E21.646, E29.304
    See application file for complete search history.

(56) References Cited

U.S. PATENT DOCUMENTS

| | | | | |
|---|---|---|---|---|
| 4,184,207 A | * | 1/1980 | McElroy ............... 365/185.16 |
| 4,751,558 A | * | 6/1988 | Kenney ............... 257/302 |
| 4,785,337 A | * | 11/1988 | Kenney ............... 257/304 |
| 4,833,094 A | * | 5/1989 | Kenney ............... 438/243 |
| 4,860,070 A | * | 8/1989 | Arimoto et al. ............ 257/301 |
| 5,196,722 A | | 3/1993 | Bergendahl et al. |
| 5,252,845 A | | 10/1993 | Kim et al. |
| 5,315,142 A | * | 5/1994 | Acovic et al. ............... 257/316 |
| 5,432,365 A | * | 7/1995 | Chin et al. ............... 257/301 |
| 5,567,635 A | * | 10/1996 | Acovic et al. ............... 438/259 |
| 5,705,415 A | | 1/1998 | Orlowski et al. |
| 5,721,448 A | * | 2/1998 | Hauf et al. ............... 257/501 |
| 5,824,580 A | * | 10/1998 | Hauf et al. ............... 438/243 |
| 5,914,523 A | * | 6/1999 | Bashir et al. ............... 257/520 |
| 5,923,046 A | | 7/1999 | Tezuka et al. |
| 5,969,383 A | | 10/1999 | Chang et al. |
| 5,998,263 A | * | 12/1999 | Sekariapuram et al. ...... 438/259 |

(Continued)

OTHER PUBLICATIONS

Osabe, et al. "Charge-Injection Length in Silicon Nanocrystal Memory Cells," VLSI, p. 242, 2004.

(Continued)

*Primary Examiner*—Matthew Smith
*Assistant Examiner*—Jarrett J Stark (57) ABSTRACT

A method of making an array of storage cells includes a first source/drain region underlying a first trench defined in a semiconductor substrate and a second source/drain region underlying a second trench in the substrate. A charge storage stack lines each of the trenches where the charge storage stack includes a layer of discontinuous storage elements (DSEs). A control gate overlies the first trench. The control gate may run perpendicular to the trenches and traverse the first and second trenches. In another implementation, the control gate runs parallel with the trenches. The storage cell may include one or more diffusion regions occupying an upper surface of the substrate between the first and second trenches. The diffusion region may reside between first and second control gates that are parallel to the trenches. Alternatively, a pair of diffusion regions may occur on either side of a control gate that is perpendicular to the trenches.

20 Claims, 7 Drawing Sheets

U.S. PATENT DOCUMENTS

| | | | |
|---|---|---|---|
| 6,074,954 A * | 6/2000 | Lill et al. | 438/710 |
| 6,117,733 A | 9/2000 | Sung et al. | |
| 6,121,148 A * | 9/2000 | Bashir et al. | 438/692 |
| 6,228,706 B1 | 5/2001 | Horak et al. | |
| 6,265,268 B1 | 7/2001 | Halliyal et al. | |
| 6,281,064 B1 | 8/2001 | Mandelman et al. | |
| 6,307,782 B1 | 10/2001 | Sadd et al. | |
| 6,320,784 B1 | 11/2001 | Muralidhar et al. | |
| 6,330,184 B1 | 12/2001 | White et al. | |
| 6,365,452 B1 | 4/2002 | Perng et al. | |
| 6,399,441 B1 | 6/2002 | Ogura et al. | |
| 6,486,028 B1 * | 11/2002 | Chang et al. | 438/259 |
| 6,559,032 B2 | 5/2003 | Gonzalez et al. | |
| 6,583,466 B2 * | 6/2003 | Lin et al. | 257/314 |
| 6,638,810 B2 | 10/2003 | Bakli et al. | |
| 6,673,681 B2 | 1/2004 | Kocon et al. | |
| 6,674,120 B2 | 1/2004 | Fujiwara | |
| 6,677,204 B2 | 1/2004 | Cleeves et al. | |
| 6,706,599 B1 | 3/2004 | Sadd et al. | |
| 6,750,499 B2 | 6/2004 | Wu | |
| 6,803,620 B2 | 10/2004 | Moriya et al. | |
| 6,818,512 B1 | 11/2004 | Hsieh | |
| 6,818,939 B1 | 11/2004 | Hadizad | |
| 6,894,339 B2 | 5/2005 | Fan et al. | |
| 6,916,715 B2 | 7/2005 | Hsiao et al. | |
| 6,936,887 B2 | 8/2005 | Harari et al. | |
| 7,015,537 B2 | 3/2006 | Lee et al. | |
| 7,078,286 B1 | 7/2006 | Mehta | |
| 7,098,502 B2 | 8/2006 | Mathew et al. | |
| 7,199,419 B2 | 4/2007 | Haller | |
| 7,211,858 B2 * | 5/2007 | Prinz | 257/324 |
| 7,220,634 B2 | 5/2007 | Prall et al. | |
| 2002/0151136 A1 | 10/2002 | Lin et al. | |
| 2003/0062565 A1 | 4/2003 | Yamazaki et al. | |
| 2003/0068864 A1 | 4/2003 | Il-yong et al. | |
| 2004/0000688 A1 * | 1/2004 | Harari et al. | 257/315 |
| 2004/0121540 A1 | 6/2004 | Lin | |
| 2004/0248371 A1 | 12/2004 | Wang | |
| 2005/0037576 A1 * | 2/2005 | Chen et al. | 438/259 |
| 2005/0148173 A1 | 7/2005 | Shone | |
| 2005/0259475 A1 * | 11/2005 | Forbes | 365/185.28 |
| 2005/0280089 A1 * | 12/2005 | Forbes | 257/347 |
| 2005/0280094 A1 * | 12/2005 | Forbes | 257/368 |
| 2006/0011966 A1 | 1/2006 | Wang | |
| 2006/0046383 A1 | 3/2006 | Chen et al. | |
| 2006/0131640 A1 | 6/2006 | Yu et al. | |
| 2006/0152978 A1 * | 7/2006 | Forbes | 365/185.28 |
| 2006/0166443 A1 * | 7/2006 | Forbes | 438/266 |

OTHER PUBLICATIONS

Ma, et al. "A Dual-Bit Split-Gate EEPROM (DSG) Cell in Contactless Array for Single-Vcc High Density Flash Memories," IEDM, p. 57-60, 1994.

"Twin MONOS Cell with Dual Control Gates," VLSI Technology, Source-Side Injection Cell with Two Storage Regions Forming in Nitride, p. 122, 2000.

"Vertical Floating-Gate 4.5/sup 2/split-gate NOR Flash Memory at 110nm Node," VLSI Technology, Source-Side Injection Cell in a Trench, p. 72, 2004.

U.S. Appl. No. 10/961,295, filed Oct. 8, 2004.
U.S. Appl. No. 11/188,582, filed Jul. 25, 2005.
U.S. Appl. No. 11/188,584, filed Jul. 25, 2005.
U.S. Appl. No. 11/188,585, filed Jul. 25, 2005.
U.S. Appl. No. 11/188,588, filed Jul. 25, 2005.
U.S. Appl. No. 11/188,591, filed Jul. 25, 2005.
U.S. Appl. No. 11/188,603, filed Jul. 25, 2005.
U.S. Appl. No. 11/188,604, filed Jul. 25, 2005.
U.S. Appl. No. 11/188,615, filed Jul. 25, 2005.
U.S. Appl. No. 11/188,898, filed Jul. 25, 2005.
U.S. Appl. No. 11/188,909, filed Jul. 25, 2005.
U.S. Appl. No. 11/188,910, filed Jul. 25, 2005.
U.S. Appl. No. 11/188,935, filed Jul. 25, 2005.
U.S. Appl. No. 11/188,939, filed Jul. 25, 2005.
U.S. Appl. No. 11/188,953, filed Jul. 25, 2005.
U.S. Appl. No. 11/188,999, filed Jul. 25, 2005.
U.S. Appl. No. 11/525,747, filed Sep. 22, 2006.

Guan, H., et al. "An Analytical Model for Optimization of Programming Efficiency and Uniformity of Split Gate Source-Side Injection Superflash Memory," IEEE Transactions on Electron Devices, vol. 50, No. 3, pp. 809-815, Mar. 2003.

Hayashi, Y., et al. "Twin MONOS Cell with Dual Control Gates," 2000 Symposium on VLSI Technology Digest of Technical Papers, pp. 122-123, 2000.

Lee, D., et al. "Vertical Floating-Gate 4.5F2 Split-Gate NOR Flash Memory at 110nm Node," 2004 Symposium on VLSI Technology Digest of Technical Papers, pp. 72-73, 2004.

Van Houdt, J., et al. "An Analytical Model for the Optimization of Source-Side Injection Flash EEPROM Devices," IEEE Transactions on Electron Devices, vol. 42, No. 7, pp. 1314-1320, Jul. 1995.

Actions on the Merits by U.S.P.T.O, as of Jul. 26, 2007, 8 pages.
U.S. Appl. No. 11/626,762, filed Jan. 24, 2007.
U.S. Appl. No. 11/626,753, filed Jan. 24, 2007.
U.S. Appl. No. 11/626,768, filed Jan. 24, 2007.

* cited by examiner

HCI PROGRAMMING TABLE

| OPERATION | CONTROL GATE 140 | S/D 112-1 | S/D 112-2 | SEMICONDUCTOR LAYER 102 |
|---|---|---|---|---|
| PROGRAM BIT 1 | $V_{PG}$ | 0 V | $V_{PD}$ | 0 V |
| PROGRAM BIT 2 | $V_{PG}$ | $V_{PD}$ | 0 V | 0 V |
| ERASE | $V_{EG}$ | OPEN | OPEN | $V_{EB}$ |
| READ/SENSE | $V_G$ | 0 V | $V_D$ | 0 V |

HCI PROGRAMMING TABLE DISCONTINUOUS CONTROL GATE

| OPERATION | CG 140-1 | CG 140-2 | S/D 112-1 | S/D 112-2 | DIFF 150 | WELL 102 |
|---|---|---|---|---|---|---|
| PROGRAM BIT 114-1 | $V_{PG}$ | X | $V_{PD}$ | X | 0 V | 0 V |
| PROGRAM BIT 114-3 | $V_{PG}$ | X | 0 V | X | $V_{PD}$ | 0 V |
| PROGRAM BIT 114-2 | X | $V_{PG}$ | X | $V_{PD}$ | 0 V | 0 V |
| PROGRAM BIT 114-4 | X | $V_{PG}$ | X | 0 V | $V_{PD}$ | 0 V |
| ERASE BITS 114-1, -3 | $V_{EG}$ | X | OPEN | X | OPEN | $V_{EB}$ |
| ERASE BITS 114-2, -4 | X | $V_{EG}$ | X | OPEN | OPEN | $V_{EB}$ |

HCI PROGRAMMING TABLE CONTINUOUS CONTROL GATE W STAGGERED S/D CONTACTS

| OPERATION | CG 140 | S/D 112-1 | S/D 112-2 | DIFF 152-1 | DIFF 152-2 | WELL 102 |
|---|---|---|---|---|---|---|
| PROGRAM BIT 114-1 | $V_{PG}$ | $V_{PD}$ | X | 0V | X | 0V |
| PROGRAM BIT 114-2 | $V_{PG}$ | $V_{PD}$ | X | X | 0V | 0V |
| PROGRAM BIT 114-3 | $V_{PG}$ | X | $V_{PD}$ | 0V | X | 0V |
| PROGRAM BIT 114-4 | $V_{PG}$ | X | $V_{PD}$ | X | 0V | 0V |
| ERASE BITS 114-1, -2 | $V_{EG}$ | OPEN | X | OPEN | OPEN | $V_{EB}$ |
| ERASE BITS 114-3, -4 | $V_{EG}$ | X | OPEN | OPEN | OPEN | $V_{EB}$ |

METHOD OF FABRICATING A NONVOLATILE STORAGE ARRAY WITH CONTINUOUS CONTROL GATE EMPLOYING HOT CARRIER INJECTION PROGRAMMING

RELATED APPLICATION

The subject matter of the following applications, including this application, is related: Chindalore, Hong, and Swift, Nonvolatile Storage Array with Continuous Control Gate Employing Hot Carrier Injection Programming, U.S. patent application Ser. No. 11/188,582, filed Jul. 25, 2005 and Chindalore, Hong, and Swift, Method of Fabricating a Nonvolatile Storage Array with Continuous Control Gate Employing Hot Carrier Injection Programming, U.S. patent application Ser. No. 11/188,583, filed Jul. 25, 2005.

FIELD OF THE INVENTION

The invention is in the field of semiconductor devices and, more particularly, nonvolatile storage devices.

RELATED ART

Nonvolatile storage is an important element in the design of substantially all electronic devices. In the field of wireless and portable electronic devices, nonvolatile storage must be compact and consume little power. Various nonvolatile storage cells have been proposed and implemented. Included among these conventional cells are planar storage cells and storage cells employing floating gates as a charge storage element. A planar storage cell is characterized by a planar transistor channel region typically located in proximity to an upper surface of the wafer substrate. While planar technology is mature and well understood, planar devices consume an undesirably large amount of wafer area.

With respect to the charge storage element, conventional floating gates have been made of a contiguous strip of a conductive material such as polysilicon. Conductive floating gates present a problem in devices with very thin dielectrics. Thin dielectrics are particularly susceptible to pin hole defects. With a conductive floating gate, all of the stored charge on the floating gate can leak off through a single pin hole defect in the dielectric. Moreover, conventional floating gates are not suitable for localized programming in which injected electrons are confined to a specific region of the charge storage element. Localized programming offers the prospect of multiple bit storage cells, where each bit is associated with a specific region of the charge storage element. Accordingly, it would be desirable to implement a multiple bit storage device suitable for use in an advanced processes employing very thin dielectrics where the design of the implemented device consumes less area than planar devices and devices employing conventional charge storage elements.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a semiconductor-based storage cell and a corresponding fabrication process employ a trench etched into a semiconductor substrate and a charge storage layer formed along the sidewalls of the trench. The charge storage layer preferably includes a set of discontinuous storage elements (DSEs). In this embodiment, the DSEs may be silicon nanocrystals, which are small, discreet silicon structures embedded in a dielectric layer and capable of holding a positive or negative charge. Because DSEs are not physically or electrically connected to each other, DSEs are less susceptible to charge loss through pin holes in the dielectric layer than conventional storage elements such as conventional polysilicon floating gate structures. The preferred implementation of the storage device is capable of storing multiple bits of information using hot carrier injection (HCI) programming, source side injection (SSI) programming, or both.

Figure 1:
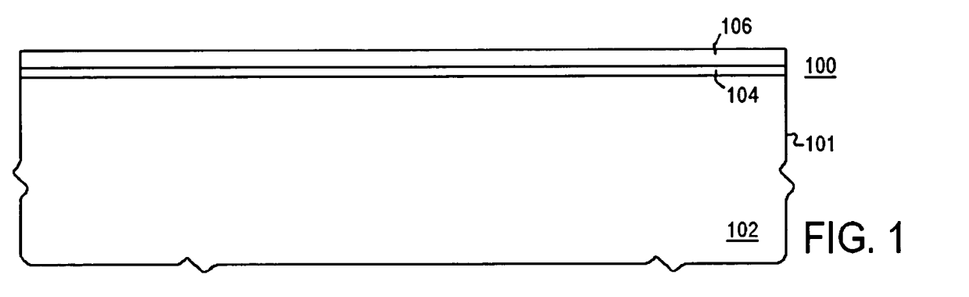
FIG. 1 is a partial cross sectional view of a wafer at an intermediate stage in a fabrication process in which a hard mask is formed on a dielectric liner over a semiconductor substrate.

Referring to the drawings, FIG. 1 through FIG. 7 depict a set of partial cross sectional views of a wafer at various stages in process for fabricating an embodiment of a nonvolatile storage device 100. In FIG. 1, a dielectric liner 104 and a hard mask 106 are formed on an upper surface of a semiconductor substrate 102 of a semiconductor wafer 101. Semiconductor substrate is preferably doped or undoped monocrystalline silicon. In other embodiments, semiconductor substrate may include other semiconductors such as germanium or various semiconductor alloys such as the m-V semiconductor alloys including gallium arsenide.

In one embodiment, dielectric liner 104 is silicon oxide, which may be thermally formed (grown) or deposited using CVD (chemical vapor deposition). Hard mask 106 is preferably a dielectric that can be selectively etched with respect to substrate 102. Hard mask 106 is preferably CVD silicon nitride, which is desirable for its ability to prevent oxidation of an underlying semiconductor. Hard mask 106 may include multiple dielectric layers.

Figure 2:
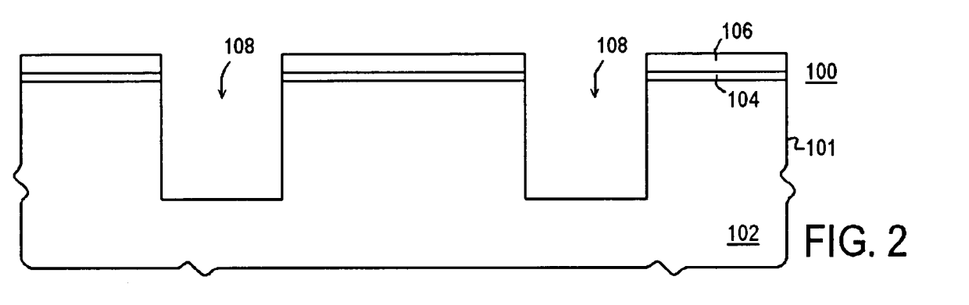
FIG. 2 depicts processing subsequent to FIG. 1 in which trenches are formed in the semiconductor substrate.

Referring now to FIG. 2, trenches 108 are formed in semiconductor substrate 102. Trenches 108 define the structure of the storage device to be formed as will become evident in the following description. Formation of trenches 108 includes conventional photolithographic patterning of dielectric liner 104 and hard mask 106 followed by a dry etch process that etches the semiconductor material (e.g., silicon) preferentially with respect to liner 104 and hard mask 106. Etch processes of this type are well known in the field of semiconductor fabrication. In the depicted implementation, trenches 108 have an aspect of approximately 1:2. A depth of trenches 108 is an implementation detail, but trenches having a depth in the range of approximately 50 nm to 300 nm are desirable for applications requiring dense storage arrays.

Figure 3:
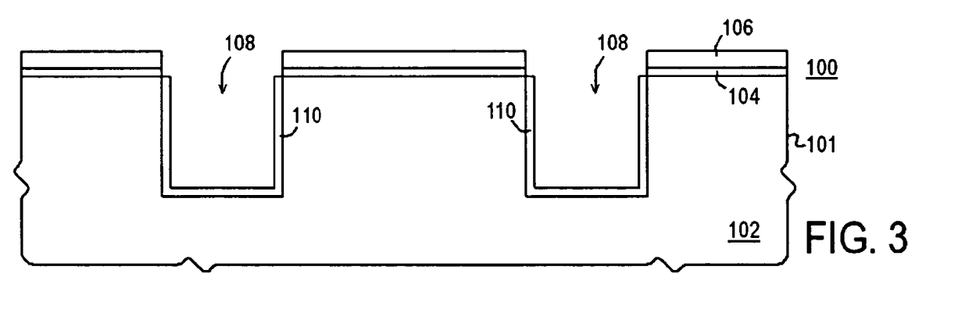
FIG. 3 depicts processing subsequent to FIG. 2 in which the trenches are lined with a bottom dielectric.

In FIG. 3, a first step in the formation of a charge storage stack is depicted, namely, the formation of a dielectric, referred to herein as bottom dielectric 110, on sidewalls and the floors of trenches 108. Bottom dielectric 110 is preferably a thin (e.g., 1 nm to 10 nm) high quality dielectric that is employed in the programming and erasing of the DSEs. A thin dielectric is preferred to achieve adequate programming times using either injection-based or tunneling-based programming techniques. A high quality dielectric is preferred to withstand the potentially large programming voltages and current and the potentially large number of programming cycles without exhibiting breakdown or significant leakage. In the preferred embodiment, bottom dielectric 110 is a thermally formed silicon dioxide film having a thickness in the range of approximately 4 to 10 nm. As depicted in FIG. 3, where hard mask 106 is a silicon nitride hard mask, thermal oxidation of the trench walls does not substantially increase the thickness of dielectric liner 104 even for embodiments in which dielectric liner 104 is a silicon oxide.

Figure 4:
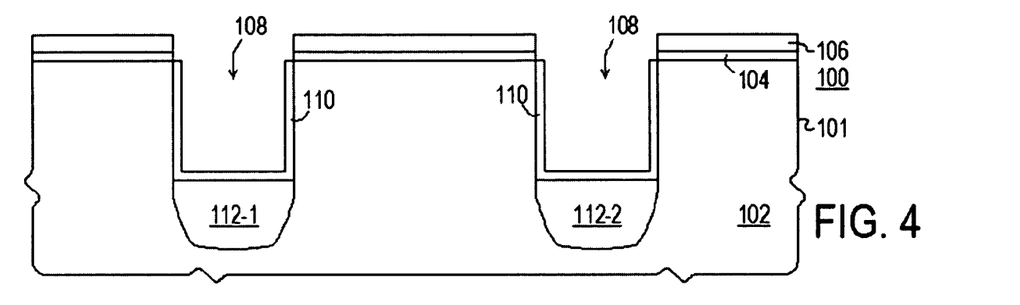
FIG. 4 depicts processing subsequent to FIG. 3 in which source/drain regions are formed underlying the trenches.

In FIG. 4, source/drain regions 112 are formed underlying trenches 108. Source/drain regions 112 are electrically conductive, heavily-doped regions having a conductivity type opposite to a conductivity type of semiconductor substrate 102. For an embodiment employing NMOS storage devices, for example, semiconductor substrate is preferably a lightly doped p-type (p−) silicon and source/drain regions 112 are heavily doped n-doped (n+) silicon having an impurity distribution in excess of 1E18 cm$^{-3}$. In one embodiment, source/drain regions 112 are buried diffusion regions formed by implanting an impurity into substrate 102 underlying trenches 108 and thereafter performing a diffusion step. In other embodiments, the implantation step may be omitted to preserve the integrity of bottom oxide 110.

Figure 5:
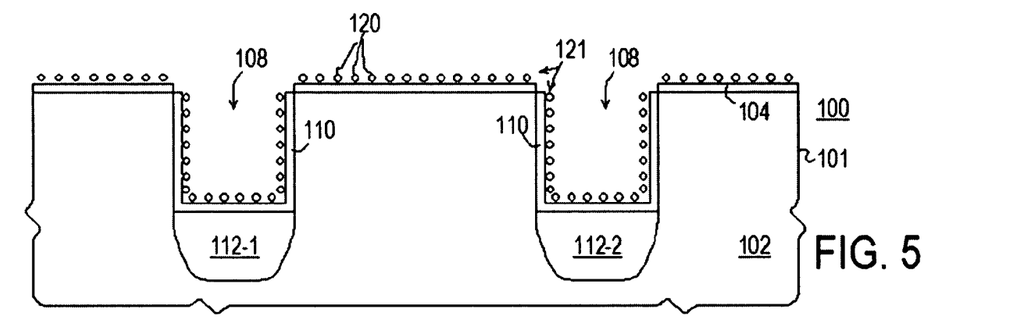
FIG. 5 depicts processing subsequent to FIG. 4 in which a layer of discontinuous storage elements is deposited.

In FIG. 5, hard mask 106 has been removed and a charge storage layer 121 has been non-selectively formed on bottom oxide 110 and an upper surface of dielectric liner 104. Charge storage layer 121 represents the structure in or on which charge will be stored to program or erase the bit or bits of storage device 100. In the depicted embodiment, charge storage layer 121 includes a plurality of DSEs 120. DSEs 120, which are implemented as nanocrystals in some embodiments, are a set of discreet accumulations of a material capable of storing a charge. Suitable materials include silicon, polysilicon, metal materials including titanium, tantalum, aluminum, alloys thereof, and the like, and dielectrics such as silicon nitride or silicon oxynitride.

In the preferred implementation, DSEs 120 are silicon nanocrystals. In this implementation, DSEs 120 may be formed in any one of a variety of ways, preferably without requiring any photolithography steps. One well-known DSE formation technique is to deposit an amorphous silicon layer and heat it to form the nanocrystals. Another technique is to deposit the nanocrystals using chemical vapor deposition (CVD). DSEs may have various shapes, including hemispherical and spherical, depending upon the deposition technique employed. In one implementation, DSEs 120 are approximately 10 nm in diameter and are spaced at a predominantly uniform spacing of approximately 10 nm. Regardless of the formation technique used, each DSE 120 in this embodiment is a particle of silicon that is electrically and physically isolated from its neighbors.

Figure 6:
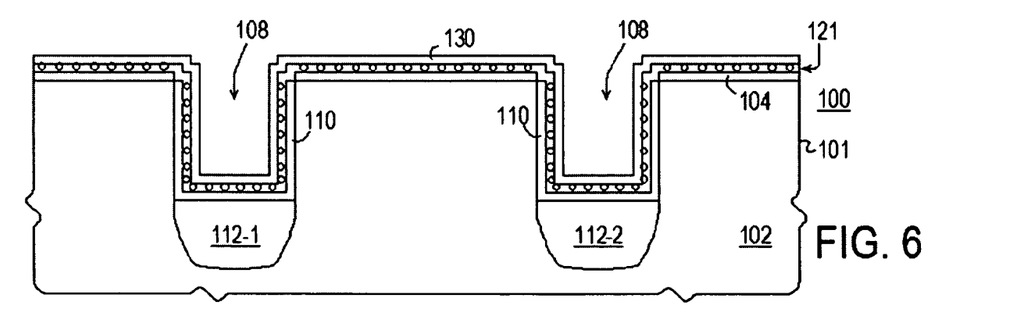
FIG. 6 depicts processing subsequent to FIG. 5 in which a top dielectric is formed on the layer of discontinuous storage elements.

Referring to FIG. 6, a top dielectric 130 has been non-selectively formed overlying charge storage layer 121 to complete the formation of a charge storage stack, which includes bottom dielectric 110, charge storage layer 121, and top dielectric 130. In the preferred embodiment, top dielectric 130 is a high temperature oxide (HTO) desirable for exhibiting characteristics (e.g., density and dielectric strength) substantially equivalent to thermally formed silicon dioxide. In this embodiment, top dielectric 130 may be formed by a conventional HTO process such as by reacting dichlorosilane and nitrous oxide at temperatures approaching C. In other embodiments, it may be desirable to employ a lower temperature process (e.g., a TEOS (tetiaethylorthosilicate) process) to prevent unintended oxidation of the silicon embodiments of DSEs 120. A thickness of top dielectric 130 is preferably in the range of approximately 5 to 10 nm.

Figure 7:
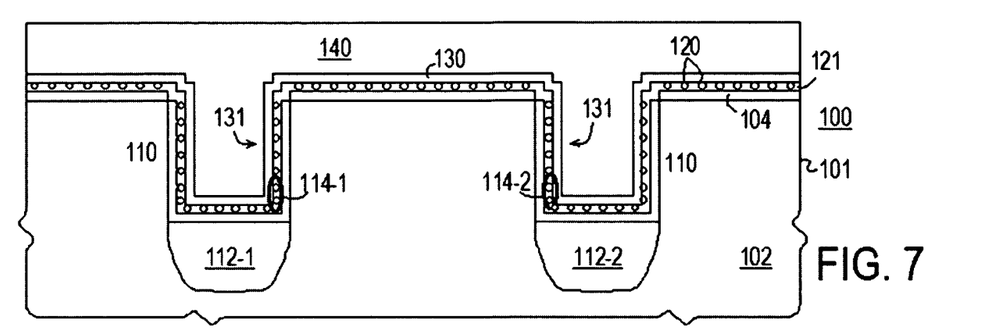
FIG. 7 depicts processing subsequent to FIG. 6 in which a continuous control gate is formed resulting in a storage devices having hot carrier injection regions.

Referring now to FIG. 7, a control gate layer 140 is formed by non-selectively depositing an electrically conductive control gate material over wafer 101 including within trenches 108 (FIG. 5). The deposited control gate material is then planarized (e.g., by chemical mechanical polish and/or etch back) to produce a substantially planar upper surface and patterned using conventional lithography and etch techniques. In one embodiment, control gate layer 140 is formed by conventional CVD of polysilicon. In this embodiment, the polysilicon may be doped either in situ or after deposition using ion implantation. In an embodiment that uses NMOS transistors, for example, control gate layer 140 may be doped with an n-type impurity such as arsenic or phosphorous. In other embodiments, control gate layer 140 may include a metal such as aluminum, copper, titanium, tungsten, alloys thereof, or the like.

Storage device 100 as depicted in FIG. 7, including contacts (not shown) to source/drain regions 112-1 and 112-2, is a fully functional storage cell. More specifically, storage device 100 as depicted in FIG. 7 is a programmable storage device suitable for employing a hot carrier injection programming technique and capable of storing two bits of information (i.e., four unique states). As depicted in FIG. 7, storage device 100 includes first and second source/drain regions 112 underlying first and second trenches 108 (see FIG. 6) defined in semiconductor substrate 102. In one embodiment, source/drain regions 112-1 and 112-2 generically or collectively referred to as source/drain region(s) 112), extend parallel to one another in a plane perpendicular to the plane of cross section shown.

Storage device 100 as depicted in FIG. 7 further includes a charge storage stack comprised of bottom oxide 104, charge storage layer 121, and top dielectric 130. A control gate layer 140 of storage device 100 serves as the gate electrode for storage device 100. In the embodiment depicted in FIG. 7, control gate layer 140 is a continuous structure that fills the trenches 108 and traverses source/drain regions 112-1 and 112-2. This embodiment is contrasted with an alternative implementation described below with respect to FIG. 8.

Storage device 100 is capable of storing two bits of information using HCI programming conditions. During HCI programming, localized regions of DSEs 120, referred to as injection regions and indicated in FIG. 7 by reference numerals 114-1 and 114-2, are programmed (have charge stored on them). Injection region 114-1, programmed using a first biasing condition, is associated with a first bit of storage device 100 while injection region 114-2, programmed with a second biasing condition, is associated with a second bit of storage device 100.

Injection region 114-1, which includes DSEs 120 proximal to source/drain region 112-1, is programmed by biasing control gate 140 to a gate programming voltage $V_{PG}$, source/drain region 112-1 to a source/drain programming voltage $V_{PD}$, and grounding source/drain region 112-2 and semiconductor substrate 102. $V_{PG}$ and $V_{PD}$ are positive for NMOS structures (in which well 102 is p-doped and source/drain regions 112 are n-doped) with $V_{PG}$ preferably being larger than $V_{PD}$ in magnitude. In one embodiment, for example, $V_{PG}$ is preferably approximately 6 V while $V_{PD}$ is approximately 5 V.

Under these biasing conditions, source/drain region 112-1 serves as the drain and electrons flow from source 112-2 to drain 112-1 along a conductive path formed in an upper portion of substrate 102. As electrons are accelerated by the electrical field resulting from the potential difference between drain 112-1 and source 112-2, they are swept into a depletion region surrounding the biased drain. Some of these highly kinetic electrons collide with atoms in semiconductor substrate lattice and generate electron-hole pairs. Some of the electrons thus generated are injected into charge storage layer 121 by the electric field attributable to the positive bias on control gate layer 140. This hot carrier injection process occurs primarily in a narrow injection zone, represented by reference numeral 114-1 in FIG. 7, in proximity to drain 112-1 where the electrical field is at its maximum. The DSEs 120 encompassed by injection zone 114-1 retain injected charges and cause a detectable alteration in the electrical characteristics of the storage device. This alteration can be sensed during a read cycle as a change in $I_{DS}$. As such, the charge stored on DSEs 120 in injection zone 114-1 correspond to a first bit of storage device 100.

A second injection zone 114-2 of charge storage device 100, including DSEs 120 proximal to source/drain region 112-2, is programmed by switching the source/drain biases with source/drain 112-2 functioning as the biased drain terminal and source/drain region 112-1 serving as the grounded source terminal. Erasing injection zones 142 and 144 may be achieved by biasing control gate layer 140 to a negative potential ($V_E$) and biasing semiconductor substrate 102 to a positive value ($V_B$). In one embodiment, suitable values for $V_E$ and $V_B$ are −6 V and 6 V respectively. The source/drain regions 112 may be floated during the erase operation. In this configuration, the erase operation erases both bits by simultaneously removing the stored charge from injection zones 114-1 and 114-2.

Figure 10:
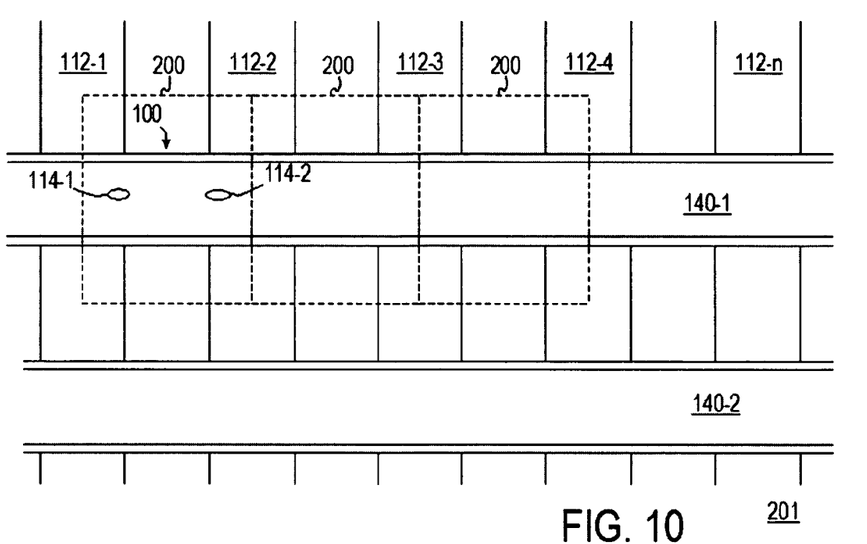
FIG. 10 is a top view of an array based on the storage device of FIG. 7.

Referring now to FIG. 10, a top view of a storage cell 200 encompassing storage device 100 is shown as part of an array 201 of storage cells 200. In the depicted embodiment, storage cell array 201 includes a set of parallel control gates 140-1 and 140-2 (generically or collectively referred to as control gate(s) 140), and a set of parallel source/drain regions 112-1 through 112-n. Control gates 140 are oriented at right angles to source/drain regions 112. In this top view, the injection regions 114-1 and 114-2 of storage device 100 are shown as residing at edges of respective source/drain regions 112-1 and 112-2 where the DSEs 120 of FIG. 7 are positioned. (DSEs 120 are not themselves visible in the top view of FIG. 10).

Figure 8:
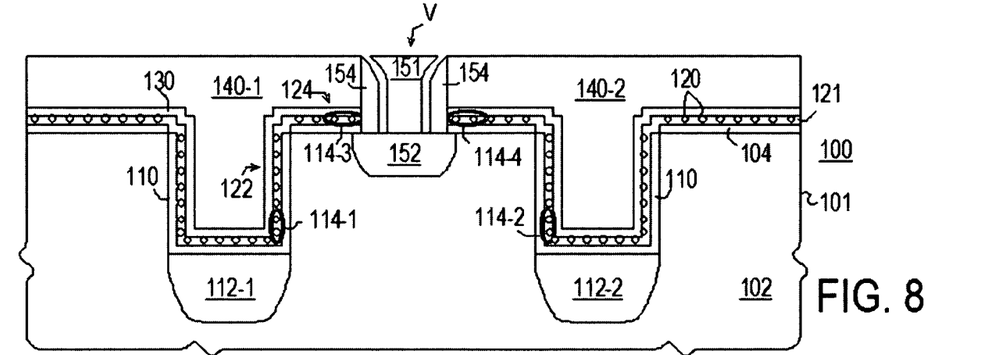
FIG. 8 depicts a second embodiment of a storage device including a diffusion contact in the wafer surface.
Figure 11:
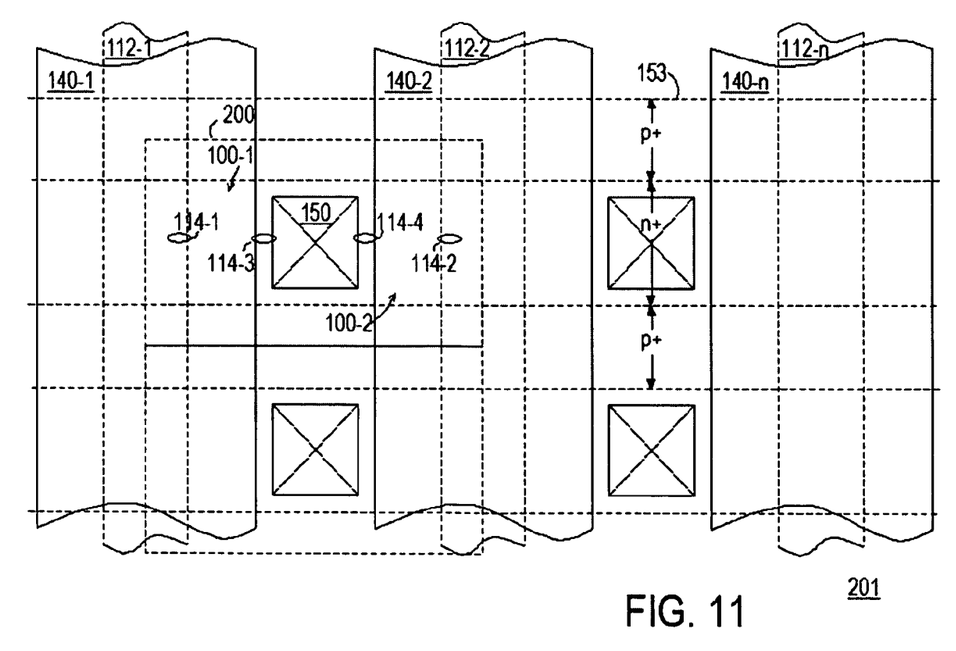
FIG. 11 is a top view of an array based on the storage device of FIG. 8.
Figure 17:
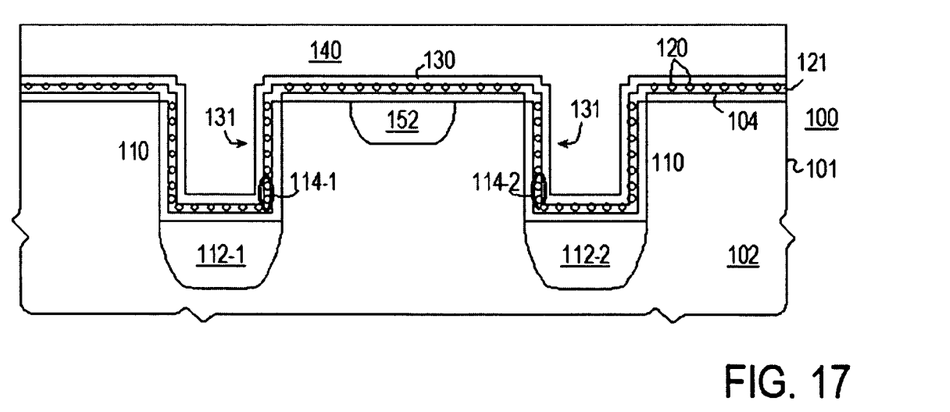
FIG. 17 is an alternative embodiment of the array depicted in FIG. 8.

An alternative embodiment of storage cell 200 is shown in the cross section of FIG. 8 and the top view of FIG. 11. As depicted in FIG. 11, storage cell 200 includes a parallel pair of source drain regions 112-1 and 112-2. Unlike the continuous control gate layer 140 of FIGS. 7 and 10, however, the embodiment of storage cell 200 depicted in FIG. 8 and FIG. 11 employs a set of parallel control gates 140-1, 140-2, etc., which run parallel to trenches 112. In this embodiment, doping and isolation of the diffusion regions 152 may be achieved using a "striped" resist mask indicated by reference numeral 153 to form alternating n+ and p+ regions in substrate 102. The implants (one n implant and one p implant) used to form these stripes are block by the control gates 140 as well as the resist masks. A variation of the embodiment depicted in FIG. 8 is the "virtual ground array" embodiment depicted in FIG. 17. In this embodiment, the diffusion region 152 of FIG. 8 is present, but without a contact within the array. In this embodiment, the diffusion region 152 extends across the array parallel to source/drain regions 112 without making contact to a metalization layer within the array. Eliminating contact 152 simplifies the cell design and enables smaller cell sizes. Forming the diffusion region 152 without forming the contact may include using a masking step after forming the trenches to define the location of the isolation implants.

In the depicted embodiment, contact structure 150 includes a conductive plug 151 within a void defined by sidewall spacers 154. In this embodiment, diffusion region 152 is of the same conductivity type as source/drain regions 112 (e.g., n-type for NMOS implementations).

In the configuration depicted in FIG. 8 and FIG. 11. Storage cell 200 encompasses two storage devices 100-1 and 100-2 and a total of four bits indicated by HCI injection regions 114-1 through 114-4. Storage device 100-1 of storage cell 200 includes control gate 140-1, source/drain region 112-1, and HCI programmable injection regions 114-1 and 114-3 while storage device 100-2 includes control gate 140-2, source/drain region 112-2, and injection regions 114-2 and 114-4. Both storage cells use the contact 150 and the underlying source/drain region 152 In the depicted configuration, diffusion region 152 is vertically displaced relative to source/drain regions 112. Charge storage layer 121 between source/drain region 112 and diffusion region 152 includes a vertical portion 122 overlying source/drain region 112 and a horizontal portion 124 adjacent diffusion region 152.

Figure 12:
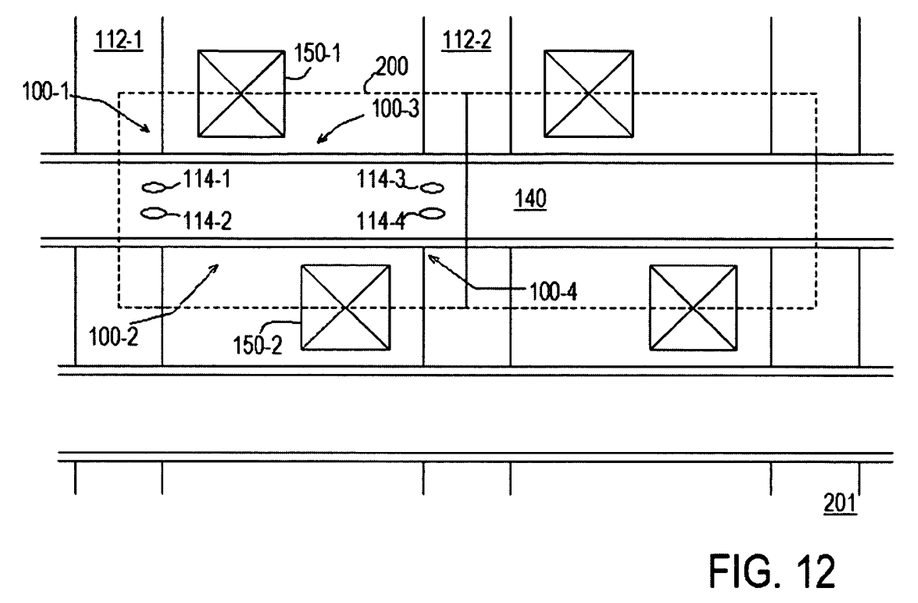
FIG. 12 is a top view of an array based on the storage device of FIG. 9.

As shown in the cross section of FIG. 8, injection region 114-3 of storage device 100-1 encompasses the DSEs 120 in the horizontal portion 124 of charge storage layer 121 proximal to diffusion region 152. Similarly, injection region 114-4 of storage device 100-2 encompasses the DSEs 120 in horizontal portion 122 of charge storage layer 121 proximal to an opposing side of diffusion region 152. Programming injection region 114-3 of storage device 100-1 includes biasing diffusion region 152 to $V_{PD}$, control gate 140-1 to $V_{PG}$, and source drain region 112-1 and semiconductor substrate to ground. Programming injection region 114-4 includes biasing diffusion region 152 to $V_{PD}$, control gate 140-2 to $V_{PG}$, and source/drain region 112-2 and semiconductor substrate to ground. Storage cell 200 is shown in FIG. 12 without backend metallization. In one embodiment, this metalization would includes diffusion region metalization connecting to contacts 150-1 and 150-2.

Figure 9:
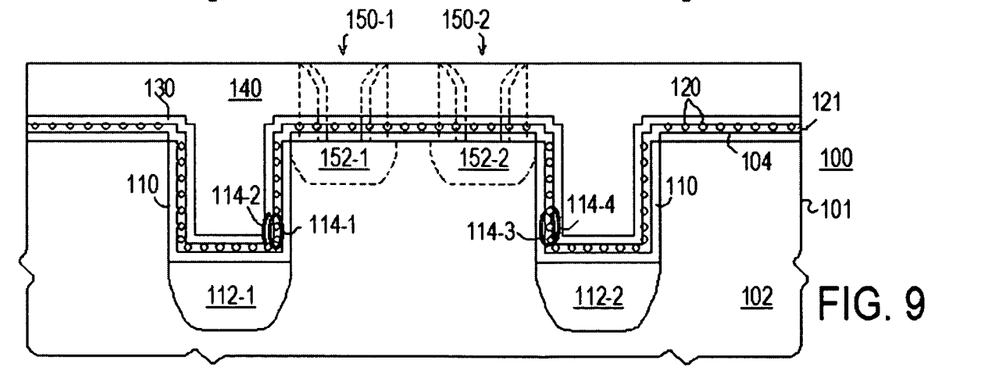
FIG. 9 depicts a third embodiment of a storage device including a continuous control gate and staggered diffusion contacts.
Figure 13:
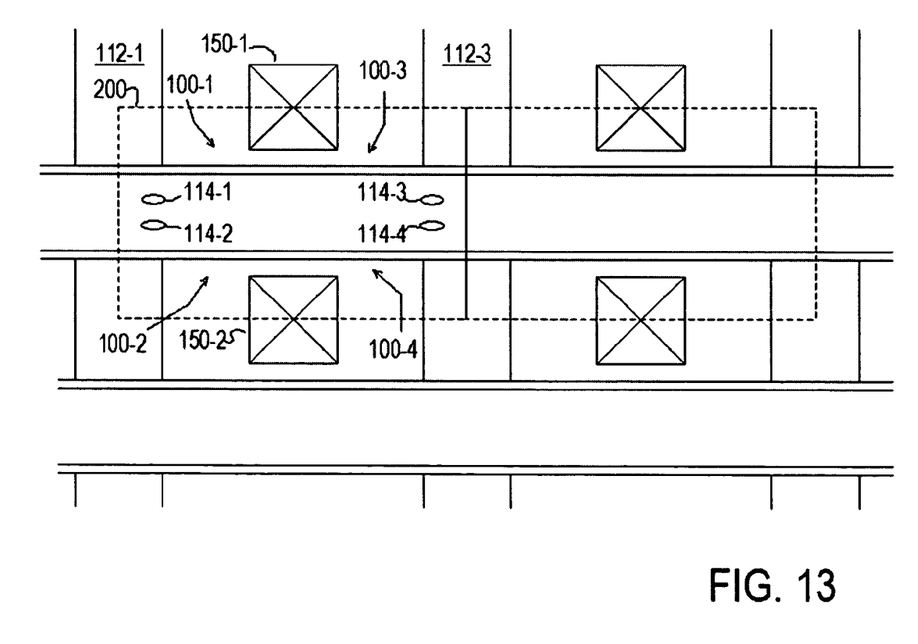
FIG. 13 is a top view of an alternative layout to the device of FIG. 12.

A third embodiment of storage cell array 201 is depicted in the cross section of FIG. 9 and the top views of and FIG. 12 and FIG. 13. In these embodiments, each storage cell 200 in array 201 includes a continuous control gate layer 140 and a pair of "staggered" contacts 150-1 and 150-2. Contacts 150-1 and 150-2 are displaced with respect to control gate layer 140 such that first contact 150-1 is positioned on a first side of control gate layer 140 while second contact 150-2 is positioned on a second side of control gate layer 140. This embodiment produces a storage cell 200 that includes four devices 100-1 through 100-4 and four HCI programmable bits corresponding to injection regions 114-1 through 114-4. Injection regions 114-1 through 114-4 include a pair of injection regions 114-1 and 114-2 located in the DSEs at the edge of source/drain region 112-1 and a pair of injection regions 114-3 and 114-4 located in the DSEs at the edge of source/drain region 112-2. Injection region 114-1 is associated with storage device 100-1, injection region 114-2 is associated with storage device 100-2, and so forth. Storage device 100-1 includes control gate 140, source/drain region 112-1, and the diffusion region 152-1 underlying contact 150-1. Storage device 100-2 includes control gate 140, source/drain region 112-1, and the diffusion region 152-2 underlying contact 150-2. As seen in FIG. 9, injection regions 114-1 and 114-2 are located in a common sidewall of charge storage layer 121. As seen in FIG. 12 and FIG. 13, injection region 114-1 is closer to contact 150-1 while injection region 114-2 is close to contact 150-2.

In FIG. 12, contacts 150-1 are 150-2 are staggered such that first contact 150-1 is closer to source/drain region 112-1 while second contact 150-2 is closer to source/drain region 112-2. In contrast, contacts 150-1 and 150-2 as depicted in FIG. 13 lie along a line that is parallel to the orientation of source/drain regions 112-1 and 112-2 such that the contacts are equidistant from source/drain regions 112-1. In either of these embodiments, contacts 150-1 and 150-2 are intended to be electrically distinct such that a first metal interconnect (not depicted) contacts first contact 150-1 while a second metal line contacts contact 150-2. The arrangement of contacts 150 as depicted in FIG. 12 simplifies the design of the metallization, but introduces an asymmetry in the configuration of the resulting transistors.

An injection region 114-1 of storage device 100-1 is programmed by biasing source/drain region 112-1 to $V_{PD}$, control gate 140 to $V_{PG}$, grounding semiconductor substrate 102 and diffusion region 152-1 underlying contact 150-1, and floating source/drain region 152-2. Conversely, programming second injection region 114-2 includes biasing source/drain region 112-1 to $V_{PD}$, control gate layer 140 to $V_{PG}$, grounding diffusion region 152-2 and semiconductor substrate 102, and floating source/drain contact 150-1. Analogous biasing is used to program injection regions 114-3 and 114-4 of electrical devices 100-3 and 100-4 respectively with the biasing of source/drain region 112-2 substituting for the biasing of source/drain regions 112-1.

Figure 14:
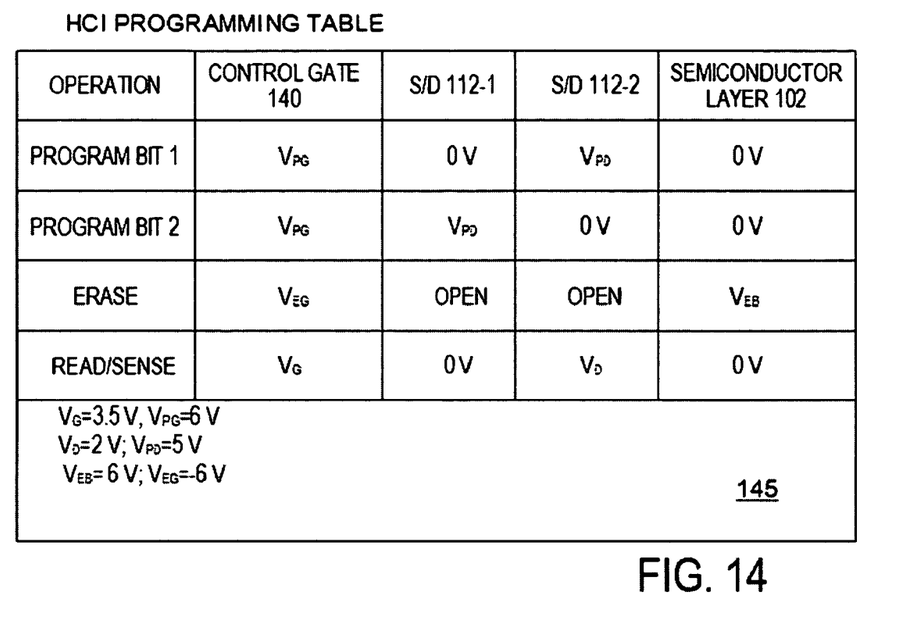
FIG. 14 is a programming table for the device of FIG. 7.
Figure 15:
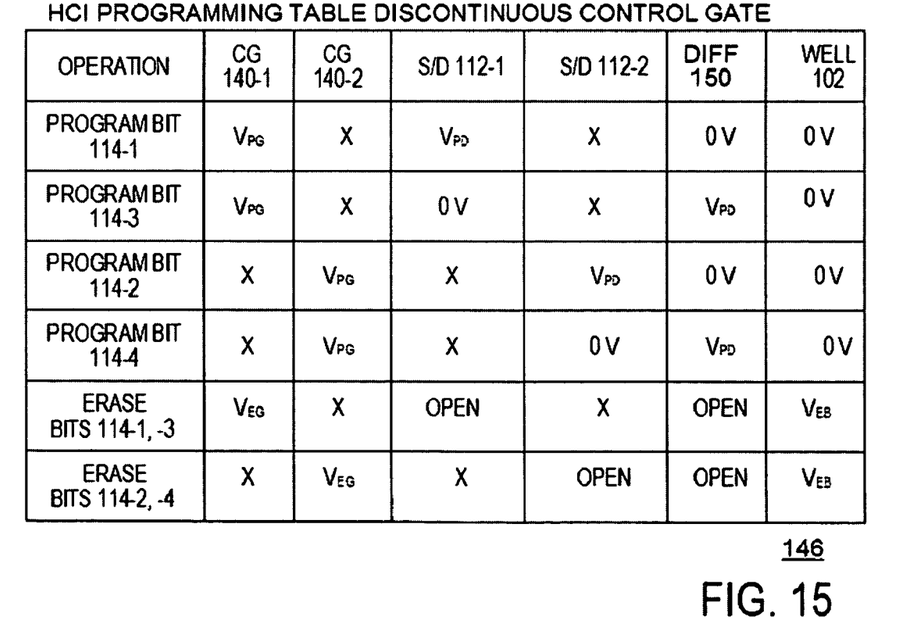
FIG. 15 is a programming table for the device of FIG. 8.
Figure 16:
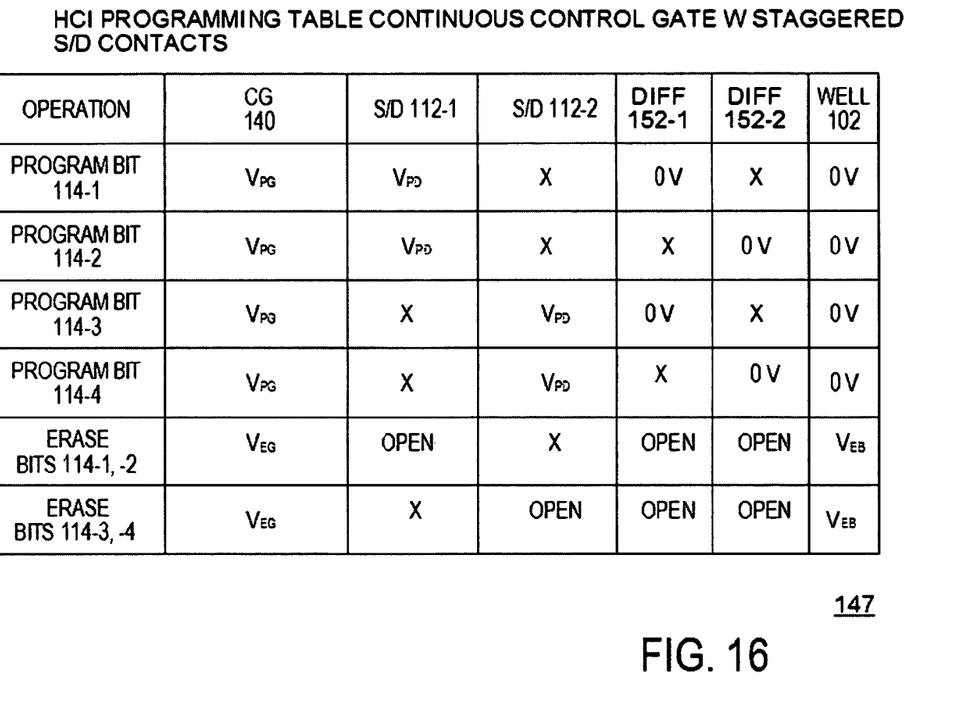
FIG. 16 is a programming table for the device of FIG. 9.

Programming tables 145, 146, and 147 depicted in FIG. 14, FIG. 15, and FIG. 16 respectively summarize the bias conditions for program and erase operations with respect to storage cell 100 as depicted in FIG. 7, FIG. 8, and FIG. 9 respectively. An "X" indicates a "no connect" (floating) condition In each case, programming an injection region 114 is achieved by biasing the appropriate control gate to $V_{PG}$ and one of the device's source/drain electrodes to $V_{PD}$. The other source/drain electrode and the substrate (also referred to as the well) are grounded. For the embodiment of storage device depicted in FIG. 7, the source/drain electrodes for device 100 are the source/drain regions 112-1 and 112-1. In FIG. 8, the source/drain electrodes of the storage device include one of the source/drain regions 112 and the diffusion region 152. For the embodiment of storage device depicted in FIG. 9, the source/drain electrodes include one of the source/drain regions 112 and one of the diffusion regions 152.

The magnitudes of the various biasing voltages are implementation specific and depends on the fabrication technology being implemented including, for example, the thickness of bottom oxide 110. In an NMOS embodiment employing a 5 to 10 nm bottom dielectric layer, $V_{PG}$ may be in the range of approximately 6 to 9 V, $V_{PD}$ in the range of approximately 3 to 6 V, and $V_{EG}$ in the range of approximately −6 to −9 V. A read operation may use a biasing configuration analogous to the programming biasing configuration, but having lower voltage magnitudes. It will be appreciated by those skilled in the design of electrically programmable storage cells that circuits capable of producing the required programming, erase, and read biasing conditions are well known.

In the foregoing specification, the invention has been described with reference to specific embodiments. However, one of ordinary skill in the art appreciates that various modifications and changes can be made without departing from the scope of the present invention as set forth in the claims below. For example, although the depicted embodiment is an NMOS transistor embodiment, PMOS embodiments are equally encompassed. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of fabricating a storage device in an array of storage devices, comprising:
   forming first and second trenches in a semiconductor substrate, wherein:
      the first trench and the second trench spaced-apart from one another:
      each of the first trench and the second trench extends from a surface of the semiconductor substrate: and
      a portion of the semiconductor substrate lies between and immediately adjacent to a first wall of the first trench and a second wall of the second trench;

forming first and second source/drain regions underlying the first and second trenches respectively;

forming a charge storage stack, wherein the charge storage stack lines the first and second trenches and overlies a portion of the semiconductor substrate between the first and second trenches, and wherein the charge storage stack includes a layer of discontinuous storage elements (DSEs); and forming a first control gate overlying the first source/drain regions and the charge storage stack, wherein a set of the DSEs overlie the portion of the semiconductor substrate between the first and second trenches, and the set of DSEs lies between the first control gate and the portion of the semiconductor substrate: and forming a first diffusion region between the first and second trenches, wherein:

the first diffusion region lies within the portion of the semiconductor substrate and at the surface of the semiconductor substrate; and the first diffusion region is spaced apart from the first wall, the second wall, or both the first and second walls.

2. The method of claim 1, wherein forming a first diffusion region comprises forming the first diffusion region after forming the first and second source/drain regions and after forming the first control gate.

3. The method of claim 2, wherein forming the first control gate includes forming a first control gate, wherein from a top view, each of the first trench and the first control gate has a width and a length that is greater than its corresponding width, and wherein the length of the first control gate is parallel to the length of the first trench.

4. The method of claim 3, further comprising isolating the first diffusion region by implanting second diffusion regions into the portion of the semiconductor substrate, wherein:

the first diffusion region lies between the second diffusion regions: and the first diffusion region has a conductivity type opposite that of the second diffusion regions.

5. The method of claim 2, further comprising forming a second diffusion region between the first and second trenches after forming the first control gate, wherein:

the second diffusion region lies within the portion of the semiconductor substrate and at the surface of the semiconductor substrate:

the second diffusion region is spaced apart from the first wall, the second wall, or both the first and second walls:

the second diffusion region is spaced apart from the first diffusion region; and the first and second diffusion regions lie along opposite sides of the first control gate.

6. The method of claim 5, wherein forming the first control gate comprises forming a first control gate, wherein from a top view, each of the first and second trenches and the first control gate has a width and a length that is greater than its corresponding width, and wherein the length of the first control gate is perpendicular to the lengths of the first and second trenches wherein the first control gate traverses the first and second trenches.

7. The method of claim 1, wherein forming the first and second trenches includes forming a dielectric liner on the substrate and a hard mask on the dielectric liner, patterning the dielectric liner and the hard mask; and etching portion of the substrate exposed by the patterned liner and hard mask.

8. A method of fabricating a storage device in an array of storage devices, comprising:

forming first and second trenches in a semiconductor substrate;

forming first and second source/drain regions underlying the first and second trenches respectively;

lining the first and second trenches with a charge storage stack, wherein the charge storage stack includes a layer of discontinuous storage elements (DSEs);

forming a first control gate overlying the first source/drain regions; and forming a first diffusion region occupying an upper portion of the substrate between the first and second trenches wherein forming the first diffusion region is performed after lining the first and second trenches with the charge storage stack.

9. The method of claim 8, wherein the first diffusion region contacts metalization only outside of the array.

10. The method of claim 8, wherein forming the first control gate includes forming a first control gate, wherein from a top view, each of the first trench and the first control gate has a width and a length that is greater than its corresponding width, and wherein the length of the first control gate is parallel to the length of the first trench.

11. The method of claim 10, further comprising isolating the first diffusion region by implanting second diffusion regions into the portion of the semiconductor substrate, wherein:

the first diffusion region lies between the second diffusion regions; and the first diffusion region has a conductivity type opposite that of the second diffusion regions.

12. The method of claim 8, further comprising forming a second diffusion region between the first and second trenches after forming the first control gate, wherein:

the second diffusion region lies within the portion of the semiconductor substrate and adjacent to the surface of the semiconductor substrate:

the second diffusion region is spaced apart from the first diffusion region:

the first and second diffusion regions lie along opposite sides of the first control gate: and forming the first diffusion region and forming the second diffusion region are performed after forming the first control gate.

13. The method of claim 12, wherein forming the first control gate comprises forming a first control gate, wherein from a top view, each of the first and second trenches and the first control gate has a width and a length that is greater than its corresponding width, and wherein the length of the first control gate is perpendicular to the lengths of the first and second trenches wherein the first control gate traverses the first and second trenches.

14. The method of claim 8, wherein forming the first and second trenches includes forming a dielectric liner on the substrate and a hard mask on the dielectric liner, patterning the dielectric liner and the hard mask; and etching portion of the substrate exposed by the patterned liner and hard mask.

15. The method of claim 12, wherein:

forming the first and second trenches, such that the first trench has a first wall, and the second trench has a second wall:

lining the first and second trenches with a charge storage stack comprises forming the layer of DSEs along the first wall of the first trench, along the second wall of the second trench, and over a portion of the semiconductor substrate lying between the first wall and the second wall: and the method further comprises forming a second control gate spaced apart from the first control gate: and forming the first diffusion region comprises forming the first diffusion region in the semiconductor substrate between the first control gate and the second control gate, wherein forming the first diffusion region is formed after forming the first control gate and forming the second control gate.

16. The method of claim 15, wherein forming the first diffusion region comprises forming the first diffusion region spaced apart from the first wall, the second wall, or both the first and second walls.

17. The method of claim 16, further comprising forming isolation regions by implanting second diffusion regions in the portion of the semiconductor substrate, wherein:

the first diffusion region lies between the second diffusion regions: and the first diffusion region has a conductivity type opposite that of the second diffusion regions.

18. A method of fabricating a storage device, comprising:

forming a first trench in a semiconductor substrate, wherein:

the first trench has a first wall, wherein the first wall has a top and a bottom; and the semiconductor substrate has a surface at the top of the first wall:

forming a first source/drain region underlying the first trench, wherein the first source/drain region has a first conductivity type;

forming a gate dielectric layer along the first wall of the trench and the surface of the semiconductor substrate:

forming a layer of discontinuous storage elements (DSEs) over the gate dielectric layer; and forming a first control gate overlying the first trench, wherein the first control gate overlies a set of DSEs, wherein the set of DSEs overlies the portion of the semiconductor substrate, wherein after forming the first control gate, substantially all of the portion of the semiconductor substrate that is immediately adjacent to the surface and directly below the first control gate has a second conductivity type that is opposite the first conductivity type.

19. The method of claim 15, wherein forming the first control gate comprises forming the first control gate, wherein from a top view, each of the first trench and the first control gate has a width and a length that is greater than its corresponding width, and wherein the length of the first control gate is perpendicular to the length of the first trench.

20. The method of claim 19, further comprising:

forming a second trench within the semiconductor substrate, wherein the second trench is spaced apart from the first trench, aid the surface at the top of the first wall extends to the second trench: and forming a second source/drain region underlying the second trench, wherein the second source/drain region has the first conductivity type.

* * * * *

UNITED STATES PATENT AND TRADEMARK OFFICE
CERTIFICATE OF CORRECTION

| | |
|---|---|
| PATENT NO. | : 7,314,798 B2 |
| APPLICATION NO. | : 11/188583 |
| DATED | : January 1, 2008 |
| INVENTOR(S) | : Gowrishankar L. Chindalore et al. |

It is certified that error appears in the above-identified patent and that said Letters Patent is hereby corrected as shown below:

Column 3, line 2, please change "m-V" to -- III-V --

Column 4, line 33, please change "tetiaethylorthosilicate" to -- tetraethylorthosilicate --

Column 8, line 61, please change "another:" to -- another; --

Column 8, line 64, please change "substrate:" to -- substrate; --

Column 9, line 14, please change "substrate:" to -- substrate; --

Column 9, line 37, please change "regions:" to -- regions; --

Column 9, line 46, please change "substrate:" to -- substrate; --

Column 9, line 48, please change "walls:" to -- walls; --

Column 10, line 37, please change "substrate:" to -- substrate; --

Column 10, line 39, please change "region:" to -- region; --

Column 10, line 41, please change "gate:" to -- gate; --

Column 10, line 61, please change "wall:" to -- wall; --

Column 10, line 67, please change "wall:" to -- wall; --

UNITED STATES PATENT AND TRADEMARK OFFICE
CERTIFICATE OF CORRECTION

PATENT NO. : 7,314,798 B2
APPLICATION NO. : 11/188583
DATED : January 1, 2008
INVENTOR(S) : Gowrishankar L. Chindalore et al.

It is certified that error appears in the above-identified patent and that said Letters Patent is hereby corrected as shown below:

Column 11, line 2, please change "gate:" to -- gate; --

Signed and Sealed this

Eleventh Day of November, 2008

JON W. DUDAS
*Director of the United States Patent and Trademark Office*